United States Patent
Hopper et al.

(10) Patent No.: US 6,797,555 B1
(45) Date of Patent: Sep. 28, 2004

(54) DIRECT IMPLANTATION OF FLUORINE INTO THE CHANNEL REGION OF A PMOS DEVICE

(75) Inventors: Peter J. Hopper, San Jose, CA (US); Prasad Chaparala, Sunnyvale, CA (US); Philipp Lindorfer, San Jose, CA (US); Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/659,422

(22) Filed: Sep. 10, 2003

(51) Int. Cl.$^7$ .................. H01L 21/8238; H01L 21/338; H01L 21/336

(52) U.S. Cl. .................. 438/217; 438/301; 438/174

(58) Field of Search ................. 438/182, 184, 438/301, 302, 174, 217, 528, 591, 777

(56) References Cited

U.S. PATENT DOCUMENTS

| | | | | |
|---|---|---|---|---|
| 4,965,218 A | * | 10/1990 | Geissberger et al. | 438/182 |
| 5,571,734 A | * | 11/1996 | Tseng et al. | 438/591 |
| 6,069,062 A | * | 5/2000 | Downey | 438/528 |
| 6,436,848 B1 | * | 8/2002 | Ramkumar | 438/777 |
| 6,693,012 B2 | * | 2/2004 | Mouli et al. | 438/302 |
| 6,720,213 B1 | * | 4/2004 | Gambino et al. | 438/184 |
| 6,740,935 B2 | * | 5/2004 | Kitamura | 257/357 |
| 6,747,318 B1 | * | 6/2004 | Kapre et al. | 257/368 |

OTHER PUBLICATIONS

"The Effects of Fluorine on Parametrics and Reliability in a 0.18-$\mu$m 3.5/6.8 nm Dual Gate Oxide CMOS Technolgoy". Terence B. Hook et al.; IEEE Transactions on Electron Devices, vol. 48, No. 7, Jul. 2001; pp 1346–1353.

* cited by examiner

Primary Examiner—John F. Niebling
Assistant Examiner—Walter L. Lindsay, Jr.
(74) Attorney, Agent, or Firm—Stallman & Pollock LLP

(57) ABSTRACT

Fluorine is implanted directly into the channel region of a PMOS transistor structure, thereby improving the noise and $V_T$ drift margin of device performance by introducing Si—F complexes at the substrate-gate oxide interface.

8 Claims, 3 Drawing Sheets

DIRECT IMPLANTATION OF FLUORINE INTO THE CHANNEL REGION OF A PMOS DEVICE

TECHNICAL FIELD

The present invention relates to the implantation of fluorine directly into the channel region of a PMOS transistor structure to improve the 1/f noise and $V_T$ drift margin of the device performance.

BACKGROUND OF THE INVENTION

Mixed signal integrated circuits find the option of dual (or more) gate oxide processes attractive in that multiple voltages can then be used on the same chip. This technique requires that gate oxides be grown twice, to result in different gate oxide thicknesses, and often with different well implantations, so as to provide optimal performance for both the high voltage and the low voltage transistors.

Hook et al., "The Effects of Flourine on Parametrics and Reliability in a 0.18$\mu$m 3.5/6.8 nm Dual Gate Oxide CMOS Technology", IEEE Transactions on Electron Devices, Vol. 48, No. 7, July 2001, pp. 1346–1353, discuss the benefits of the introduction of fluorine into gate oxide by implantation into the gate polysilicon in PMOS devices.

For reasons of mask count reduction, and thus cost, it is attractive to make use of common source-drain implants, spacer formation and silicidation processing, which are common to both high and low voltage transistors.

DETAILED DESCRIPTION

High voltage PMOS transistors are known to be susceptible to threshold voltage ($V_T$) drift, gate induced drain leakage (GIDL), and trap induced noise (1/f). The present invention utilizes the implantation of fluorine directly into the channel region of the PMOS transistor, at the time that an N-well implant stack is processed, for example, to improve the analog performance of the high voltage PMOS device without an additional mask cost.

Figure 1:
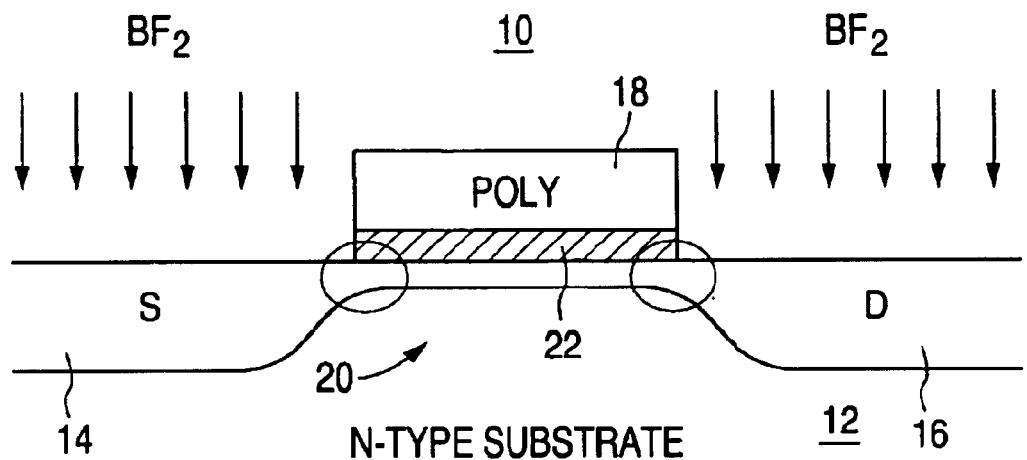
FIG. 1 is a cross section drawing illustrating a conventional PMOS transistor structure.
Figure 2:
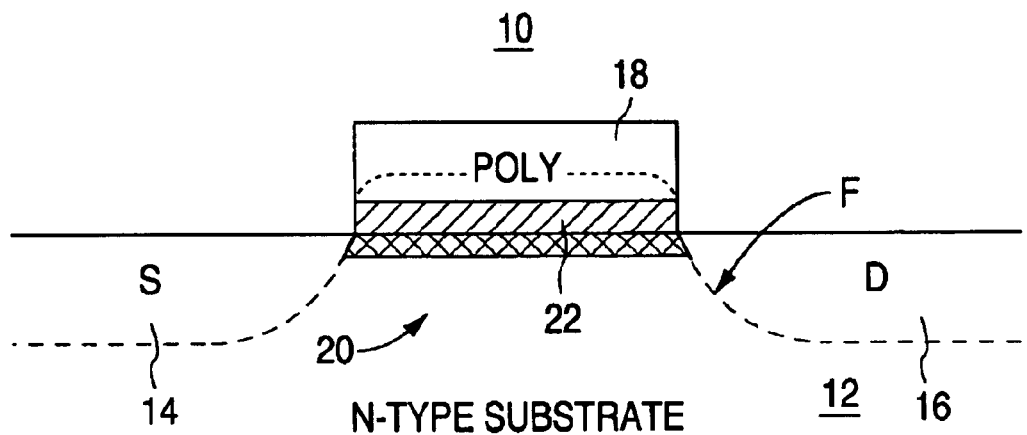
FIG. 2 is a cross section drawing illustrating the Flourine profile in a conventional PMOS transistor structure.

FIG. 1 shows a conventional PMOS transistor structure 10 formed in N-type semiconductor material 12, typically silicon. The PMOS structure 10 includes a P-type source region 14 and a P-type drain region 16 formed by the introduction of P-type dopant into the N-type semiconductor material 12. The polysilicon gate electrode 18 of the PMOS device is separated from the channel region 20 by intervening gate dielectric material 22, e.g. silicon dioxide. FIG. 1 illustrates one conventional method of introducing P-type dopant into the semiconductor material 12 by utilizing the poly gate 18 for the self-aligned ion implantation of BF2; utilizing BF2 provides for the diffusion of fluorine into the edges of the channel region 20, i.e. the circled regions in FIG. 1, to somewhat improve the GIDL and trap induced noise issues mentioned above. FIG. 2 shows the fluorine profile in the PMOS structure 10 resulting from utilizing BF2 in a self-aligned implant. Ad discussed in the Hook et al. publication, the presence of Flourine in the gate poly 18 and the gate oxide can foster Boron migration through the gate oxide, thereby impacting on the reliability of the device. Boron diffusion or penetration through the gate oxide can lead to lessened control of the threshold of the device and related channel leakage. As Flourine in the gate oxide is known to increase the diffusivity of the Boron, there therefore exists a device design preference to keep Flourine out of the gate oxide to a greater extent than is the case when high dose BF2 implants are used. A dose of Flourine, implanted deeper into the channel, but still close enough to the surface to passivate traps, will thus gain the benefits of both lessened boron penetration and Flourine-based trap passivation.

FIGS. 3A–3D show one sequence of steps that can be utilized to fabricate a PMOS transistor structure in accordance with the concepts of the present invention.

Figure 3A:
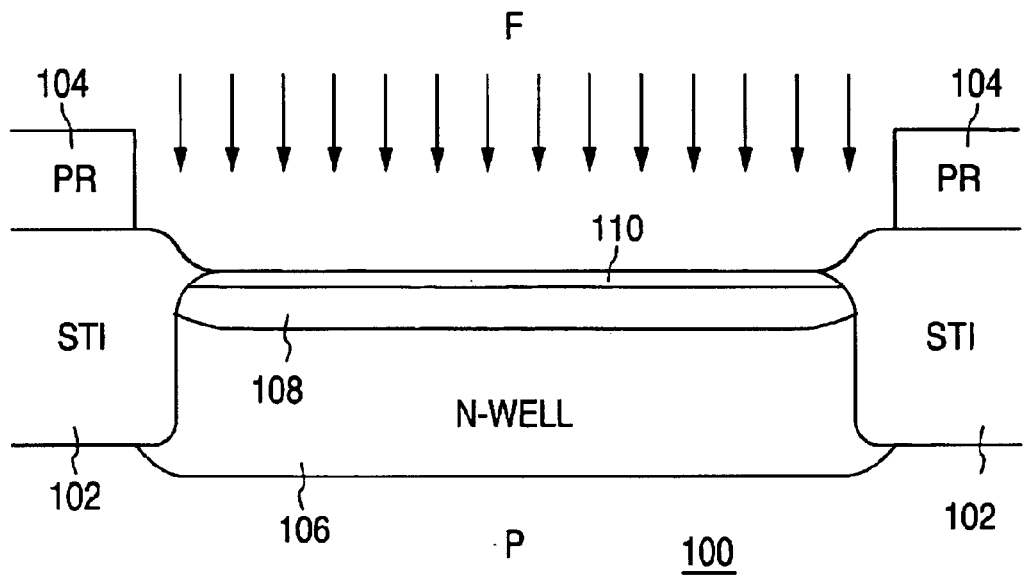
FIGS. 3A–3D provide a sequence of cross section drawings illustrating a method of fabricating a PMOS transistor structure with a Flourine-doped channel region in accordance with the present invention.

FIG. 3A shows a conventional shallow trench isolation (STI) structure 102 formed in a semiconductor substrate 100. In the illustrated embodiment, the semiconductor substrate 100 is P-type silicon. The upper surface of the active device region defined by the STI structure 102 is exposed by an opening formed in patterned photoresist mask (PR) 104. An N-well 106 has been formed in the active region utilizing conventional techniques. FIG. 3A also shows the formation of an optional n+ threshold adjustment region 108 using the same mask structure utilized to form the N-well 106. In accordance with the concepts of the present invention, the same mask structure utilized to form the N-well 106 (and, optionally, the $V_t$ adjustment region 108) is for the ion implantation of Flourine directly into an upper surface area 110 of the N-well 106.

Figure 3B:
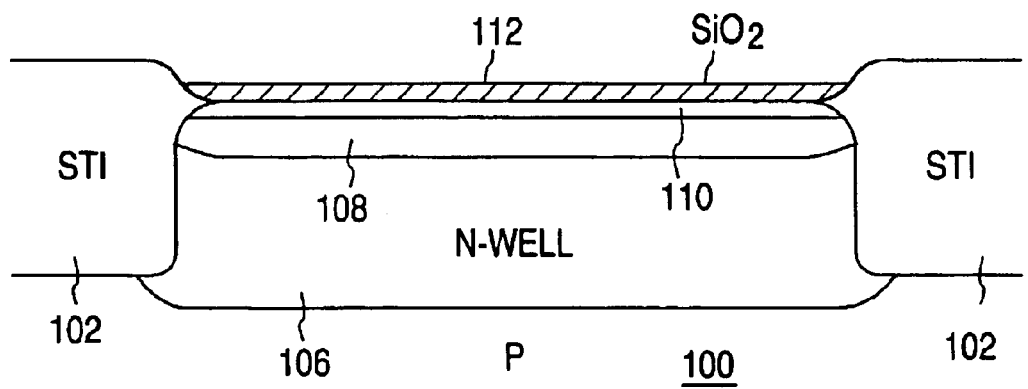
Figure 3C:
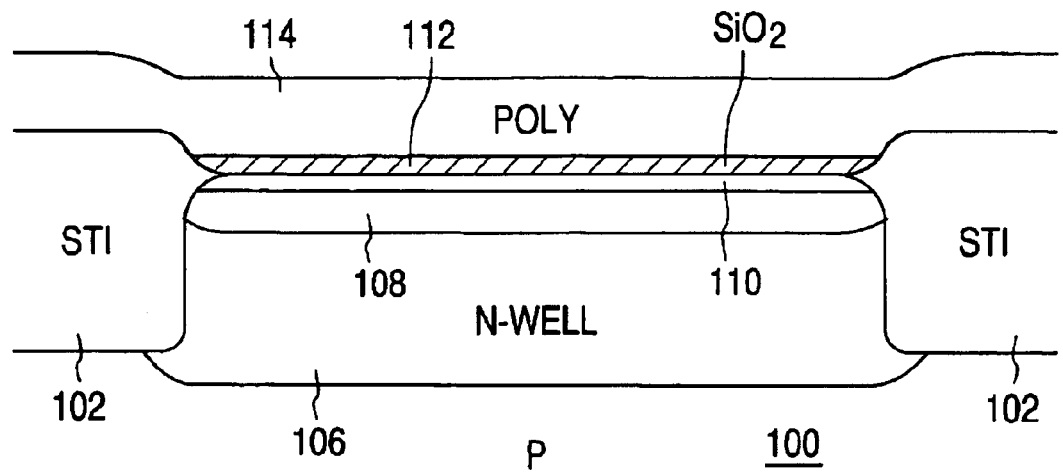

FIG. 3B shows that, following the removal of the PR mask 104, a layer of gate dielectric material 112, e.g. thermally grown silicon dioxide, is formed on the upper surface of the N-well 106. As shown in FIG. 3C, a layer of undoped (???) polysilicon 114 is then formed on the gate dielectric material 112 by well-known methods.

Figure 3D:
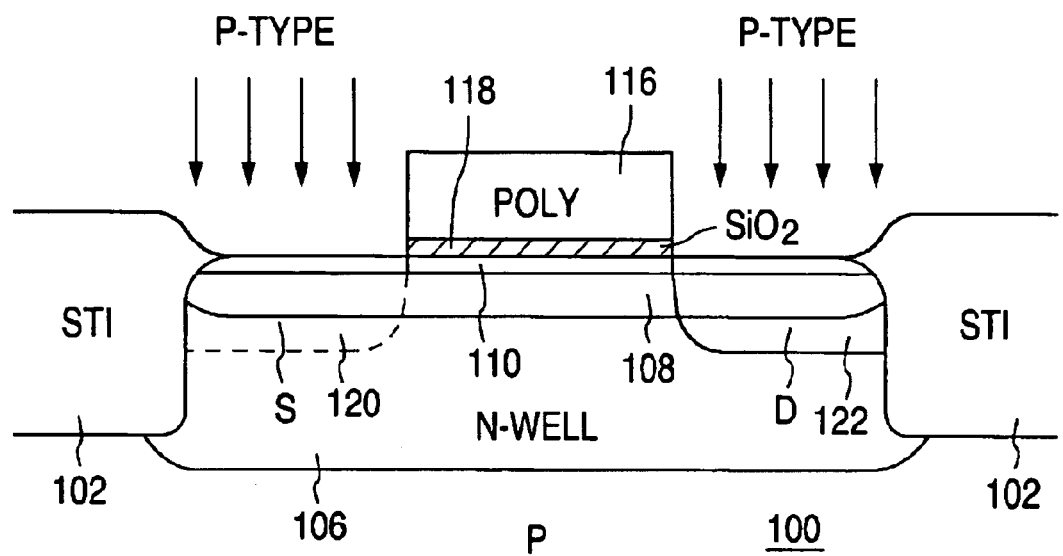

Referring to FIG. 3D, utilizing conventional techniques, the poly layer 114 is then masked and a stacked gate etch is performed to define a poly gate electrode 116 that is separated from the N-well 106 by intervening gate oxide 118. P-type dopant, e.g. BF2 or B, is then introduced into the N-well 106 at the sides of the poly gate 108 in a self-aligned ion implant step that results in the formation of P-type source (S) region 120 and P-type drain (D) region 122 to complete this embodiment of a PMOS transistor structure.

Of course those skilled in the art will appreciate that the key feature of the fabrication method disclosed above is the introduction of Flourine into the channel region of the PMOS device, and not the particular sequence of steps for its fabrication or the specific details of its final structure. Other fabrication sequences and PMOS device structures are contemplated as being within the scope of the invention. By way of example, not limitation, the concepts of the invention include implanting Flourine through a sacrificial oxide prior to clean and gate oxide growth, implanting Flourine through the gate oxide into the channel region below, and, after poly gate metal etch, implanting Flourine at an angle similar to that of a conventional halo implant and at the same time as a halo implant so as to angle the dose into the source-drain/gate overlap regions.

The use of Flourine implantation directly into the channel region of a PMOS transistor improves the noise and $V_t$ drift margin of device performance by introducing Si—F complexes at the interface between the N-well Silicon and the gate oxide. Importantly, this technique avoids additional issues typically associated with the use of Flourine; namely, Flourine is known to raise the diffusivity of Boron in oxides and, hence, can lead to penetration of boron from poly gates into the channel region for the case of thin oxides.

It is believed that the concepts disclosed above will not work as effectively for N+ on P-diodes since, as mentioned in the Hook et al. publication, traps in the upper half of the bandgap will increase in these structures with the introduction of Flourine.

Although only specific embodiments of the present invention are shown and described herein, the invention is not to be limited by these embodiments. For example, Deuterium, rather than Flourine, can be used with similar results. Rather, the scope of the invention is to be defined by these descriptions taken together with the attached claims and their equivalents.

What is claimed is:

1. A method of making a PMOS transistor structure in semiconductor material having n-type conductivity, the method comprising:

introducing fluorine into an upper surface area of the n-type semiconductor material;

forming a conductive gate electrode over the n-type semiconductor material and separated therefrom by intervening dielectric material, the conductive gate electrode having first and second sides; and introducing p-type dopant into the n-type semiconductor material at the first and second sides of the conductive gate electrode to form a p-type source region and a p-type drain region, respectively, in the n-type semiconductor material, the p-type source and drain regions being spaced-apart to define a channel region therebetween, whereby the channel region includes fluorine at its upper surface.

2. The method of claim 1, and wherein the step of introducing fluorine consists of implanting fluorine ions into the upper surface area of the n-type semiconductor material.

3. The method of claim 2, and wherein the step of introducing p-type dopant comprises implanting BF2 into the n-type semiconductor material.

4. The method of claim 2, and wherein the step of introducing p-type dopant comprises implanting Boron into the n-type semiconductor material.

5. The method of claim 1, and wherein the semiconductor material comprises silicon.

6. The method of claim 1, and wherein the dielectric material comprises silicon oxide.

7. The method of claim 1, and wherein the conductive gate electrode comprises polysilicon.

8. A method of making a PMOS transistor structure in semiconductor material having n-type conductivity, the method comprising:

introducing deuterium into an upper surface area of the n-type semiconductor material;

forming a conductive gate electrode over the n-type semiconductor material and separated therefrom by intervening dielectric material, the conductive gate electrode having first and second sides; and introducing p-type dopant into the n-type semiconductor material at the first and second sides of the conductive gate electrode to form a p-type source region and a p-type drain region, respectively, in the n-type semiconductor material, the p-type source and drain regions being spaced-apart to define a channel region therebetween, whereby the channel region includes deuterium at its upper surface.

* * * * *